United States Patent [19]

Shimizu

[11] Patent Number: 5,033,377
[45] Date of Patent: Jul. 23, 1991

[54] GRAVURE PRINTING PLATE

[75] Inventor: Michiyoshi Shimizu, Aichi, Japan

[73] Assignees: Dainippon Screen Mfg. Co., Ltd., Kyoto; Fuji Tokushu Shigyo Co., Ltd., Aichi, both of Japan

[21] Appl. No.: 523,241

[22] Filed: May 15, 1990

[30] Foreign Application Priority Data

May 19, 1989 [JP] Japan .................................. 1-127636

[51] Int. Cl.$^5$ .............................................. B41N 1/06
[52] U.S. Cl. .................................... 101/150; 101/395
[58] Field of Search ............... 101/170, 150, 153, 395, 101/401.1; 430/307, 310, 396; 156/905

[56] References Cited

U.S. PATENT DOCUMENTS 4,158,567  6/1979  Honma et al. ....................... 430/307
4,567,827  2/1986  Fadner ................................ 101/150

FOREIGN PATENT DOCUMENTS 2534192  2/1977  Fed. Rep. of Germany ...... 101/170
59-232347  12/1984  Japan .
63-28798  6/1988  Japan .

Primary Examiner—J. Reed Fisher
Attorney, Agent, or Firm—Lowe, Price, LeBlanc and Becker

[57] ABSTRACT

A gravure printing plate is formed by a plurality of concave portions called "cells", arranged in vertical and lateral directions, four sides of each generally square cell being surrounded by walls. A "cell group" is formed of one core cell and four sets of paired cells adjacent to each other arranged to surround the core cell. A notched portion is formed in either one of two intersections of a wall and another wall intersecting therewith on the wall separating the paired cells. The positions of the notched portion is selected to be in point symmetry about the core cell. The direction of flow of a quick-drying ink, during use with the gravure printing plate, becomes random in the vertical and lateral directions in the cell group due to the notched portions, hence mottling of the ink can be prevented.

14 Claims, 9 Drawing Sheets

→: INK FLOW

1

GRAVURE PRINTING PLATE

BACKGROUND OF THE INVENTION

1. Field of the Invention

The present invention relates to a gravure printing plate and, more specifically, to a gravure printing plate capable of improving flow of ink at shadow portions thereof.

2. Description of the Related Art

Recently, sheet materials for flexible packaging formed of synthetic resin materials and the like are used for packing goods. Printing is carried out on the sheet materials for flexible packaging so as to provide good appearance and to indicate goods and contents thereof.

Gravure printing using a web-fed rotary gravure press, such as shown in FIG. 1, has been used for printing on the sheet materials for flexible packaging which is suitable for printing on the sheet materials.

Referring to FIG. 1, the gravure press comprises a gravure cylinder 7 on which a gravure printing plate 8 is wound, an impression cylinder 12 provided opposed to the gravure cylinder 7 for conveying the sheet material 11 for flexible packaging sandwiched therebetween, a doctor blade 10 for adjusting the amount of quick drying ink 5 supplied to the gravure printing plate 8, and a furnisher roll 6.

The web-fed rotary gravure press on the sheet material 11 for flexible packaging is generally referred to as "gravure for flexible packaging material", which is distinguished from "publication gravure" which is the web-fed gravure printing press on sheets of paper. The "gravure for flexible packaging material" includes three types dependent on the method of plate making, that is, conventional gravure, inverted halftone gravure, and electronic engraving gravure.

The gravure printing technique is briefly described in the following. An outline of gravure printing is disclosed in, for example, Japanese Patent Publication No. 63-28798. Referring to this document, in the gravure for flexible packaging material, a gravure printing plate is formed based on an original, and printing is carried out based thereon. The step of printing, i.e., the step in which ink is transferred from the plate to the material to be printed, is the most unstable step in which loss and deformation of characters become the largest, in the steps of transferring and reproducing image information from the original to the printed matter. The gravure printing plate is formed of minute concave portions called cells, having volumes corresponding to image density of the original.

As described above, there are three types dependent on the structure of the plate, that is, a conventional plate (FIG. 2A), an inverted halftone gravure plate (FIG. 2B) and an electronic engraving gravure plate (FIG. 2C). In any of the plates, the image density is divided into a light portion A, a middle portion B and a shadow portion C, in accordance with the volume of the cells. In printing, the ink 5 filled in the cells of the printing plate surface 8 is transferred to a material 11 to be printed. In the portion has relatively high image density, i.e., the shadow portion C where the cell volume is large, there is a flow of ink on the material 11 to be printed even in a section called a wall which is definitely distinguished on the plate surface 8. In the shadow portion C, the flow of ink 5 serves to assist the wall portion.

However, such a flow of ink causes a problem in accurately transferring image information which is formed in sections as cells on the plate surface 8. Especially in the inverted halftone gravure plate (FIG. 2B) or in the electronic engraving plate (FIG. 2C), the image information is reproduced based on the size of the opening of the cell, i.e., on the size of the dot on the material 11 to be printed, and accordingly, the quality of the printed matter is largely dependent on the change of the size of dots caused by the flow of ink.

The reason for this will be described with reference to FIGS. 3 and 4. FIG. 3 shows the relation between the density of an original and the density of a printed matter in gravure printing. FIG. 4 shows, in enlargement, the relation between the plate surface F and the print surface P in a light portion A', middle portions B' and B" and a shadow portion C' of FIG. 3.

In principle, the ideal relation between the densities of the original and the printed matter is as shown by the line I of FIG. 3. However, in practice, the above-described flow of ink is generated at the region in the middle portion, for example between the portions B' and B", where the density of the original changes slightly. Consequently, in the portion B", adjacent dots are brought into contact with each other so as to generate an abrupt change of the density of the printed matter between the portions B' and B". Namely, the density of the printed matter becomes as shown by the line II, in which a jump of density is generated at a certain portion of the middle portion, which causes reproduction with uneven tone. The portion where such jump occurs changes dependent on various conditions of the press machine (speed of printing, angle of inclination of the doctor blade, pressure of the impression cylinder, hardness, and so on), the plate (depths of cells, forms of cells and so on) and of the ink (composition, viscosity and other characteristics).

In gravure printing, the dots of the printed matter are unavoidably brought into contact with adjacent dots at the middle portion of a certain density, as shown in FIGS. 3 and 4. The reason for this is that portions formed of smaller cells are more susceptible to the influence of ink flow compared with the portions formed of larger cells or portions formed of rough point patterns formed of groups of smaller cells, even if the surface area per unit occupied by the cell portion on the plate surface is the same.

Examples of the above described gravure printing plates 8 comprise those disclosed in Japanese Patent Laying-Open No. 59-232347 (hereinafter referred to as a conventional example 1) and those which are commercially available shown in FIG. 6 (hereinafter referred to as a conventional example 2).

FIGS. 5 and 6 are both partial enlarged perspective views schematically showing plate surfaces of the gravure printing plates.

In the conventional example 1 shown in FIG. 5, the cells C for filling ink are formed by walls 2, and in the shadow portion, intersecting portions of the walls 2 are removed to form unwalled portions 3, with the bottom surfaces of the cells C continued through the unwalled portion 3.

Meanwhile, in the conventional example shown in FIG. 6, the unwalled portions 3 are formed near the intersecting portions of the walls 2 in the shadow portion and the unwalled portions 3 are formed to be arranged in a horizontally or vertically staggered manner. The bottom surfaces of the cells C are continued through the unwalled portions 3.

FIG. 7 shows a gravure printing plate 8 having the form of the conventional example 2 shown in FIG. 6, viewed from above. As shown in the figure, the ink 5 flows in a prescribed direction through unwalled portions 3. The ink 5 flows through a prescribed direction on the surface of the plate, since the ink flows to a direction opposite to the rotation of the rotary press, as the printing plate 8 is rotated in a prescribed direction on the rotary press, as shown in FIG. 1. In gravure printing, since the flow of ink is approximately in a prescribed direction as the process of printing proceeds, and the ink is of a quick-drying type, uneven flow of ink like an orange peel is generated. Those skilled in the art call this uneven flow of ink "mottling". Mottling is especially conspicuous in the shadow portions (e.g., C in FIG. 2A).

Therefore, conventionally, generation of "mottling" is reduced by setting the above mentioned conditions of the printing press and of the printing plate 8 at prescribed values based on experience. However, it is very difficult to maintain and control operating conditions. It is difficult in both conventional examples 1 and 2 to eliminate "mottling", since the unwalled portions 3 continue with prescribed pitches. When "mottling" is generated, the surface of the printed matter will appear to have thin stripes.

The details of the "mottling" will be described in the following. As shown in FIG. 1, after the ink 5 is transferred from the cells of the printing plate 8 to the object 11 to be printed, it is fed to a drying box 13 where the ink is dried. The state of the ink transferred from the cells of the printing plate 8 to the object 11 to be printed is shown in FIG. 8A. Referring to FIG. 8A, when the ink 5 is transferred onto the object 11 to be printed, the ink of each cell has a convex shape. Although there is a small flow of ink between the convexes of the ink after the ink 5 is transferred until the printed matter 11 is transferred to the drying box 13, the ink 5 does not become completely flat as shown in FIG. 8B, since the ink is of a quick-drying type and the flow of ink is in only a prescribed direction. Consequently, the heights of the convexes of the ink become varied, causing uneven density of ink. The unevenness of the ink density depends on the viscosity of the ink (viscosity), color, and the depths of the cells. In addition, it depends on the speed of printing (fast, slow). The unevenness of ink is generated when the printing speed is low and when the speed is high. When the speed is high, the stripe-shaped unevenness becomes more conspicuous.

In addition, the unevenness of ink depends on the screen ruling (175, 150*l*, 100*l*, and so on). Namely, if the ruling is small, i.e., if the mesh is rough, the unevenness becomes more conspicuous.

In the conventional example 1, all intersecting portions of the walls 2 are removed. Therefore, the wall portions 2 are cut into small pieces, the walls 2 wear much during printing, and the life of the walls 2 is not very long.

Although the problem of short life of the conventional example 1 is solved and the above-mentioned "mottling" can be reduced at a specified speed of printing in the conventional example 2, "mottling" is still generated when the speed of printing is changed.

SUMMARY OF THE INVENTION

Therefore, an object of the present invention is to provide a gravure printing plate capable of reducing wear of walls, improving life, and preventing "mottling" even if the speed of printing is changed.

An object of the present invention is to provide a gravure printing plate in which mottling is not generated.

Another object of the present invention is to provide a gravure printing plate capable of reduced wear of walls and improving the life thereof.

A further object of the present invention is to provide a gravure printing plate in which mottling is not generated, regardless of the speed of printing.

The above-described objects of the present invention can be attained by providing a gravure printing plate, comprising: a base; and a plurality of cell groups formed on the base, each cell group including nine cells formed of three cells each in a first direction and a second direction intersecting the first direction formed adjacent each other; each of the cells being surrounded by opposing two sets of walls formed in a third direction intersecting the first and second directions; an end portion in the third direction of the wall of the plurality cell groups having a flat surface forming a printing surface of the gravure printing plate. Each cell group includes a core cell positioned at the center and four paired cells adjacent each other sharing one end of the walls of the core cell, with a notched portion formed on an end portion of a wall intersecting the wall dividing the paired cells.

Since the gravure printing plate of the present invention comprises the above-described components, notched portions are formed in the walls such that the ink flow is in random directions. Since the ink flows not in a prescribed direction, the generation of uneven ink density can be prevented. Consequently, a gravure printing plate capable of preventing uneven ink flow can be provided.

In accordance with another aspect of the present invention, the gravure printing plate comprises a base; nine first cells each having four sides of walls formed adjacent each other in a first direction and in a second direction intersecting the first direction, three cells in each direction; one second cell formed adjacent, in the first or second directions, one cell at a corner of the nine first cells; the nine first cells and the one second cell forming one cell group, a wall of each cell formed in a third direction intersecting the first and second directions on the base; an end portion of the wall of the cell group in the third direction forming a flat surface, the flat surface constituting a printing surface of the gravure printing plate. Eight cells around the central cell out of the nine first cells form four paired cells adjacent each other, a notch portion is formed in a portion of the adjacent wall of the paired cells along the wall surface of the wall intersecting the adjacent wall, and the positions of the notched portions are arranged in point symmetrically about the central one of the nine first cells. A corner portion of the first cell of each of the four cell groups is adjacent each of the four sides of the second cell, and accordingly, four cell groups share the second cell.

In accordance with this aspect of the present invention, since the gravure printing plate comprises the above described components, the gravure printing plate is formed based on a of four cell groups unit, each group including ten cells sharing one central cell. There is no notch in the central cell, and notched portions are formed on the surrounding cells such that the ink flows in random directions. Consequently, a gravure printing plate capable of preventing uneven flow of ink even in the shadow portion can be provided.

The foregoing and other related objects, features, aspects and advantages of the present invention will become more apparent from the following detailed description of the present invention when taken in conjunction with the accompanying drawings.

DESCRIPTION OF THE PREFERRED EMBODIMENTS

Figure 9:
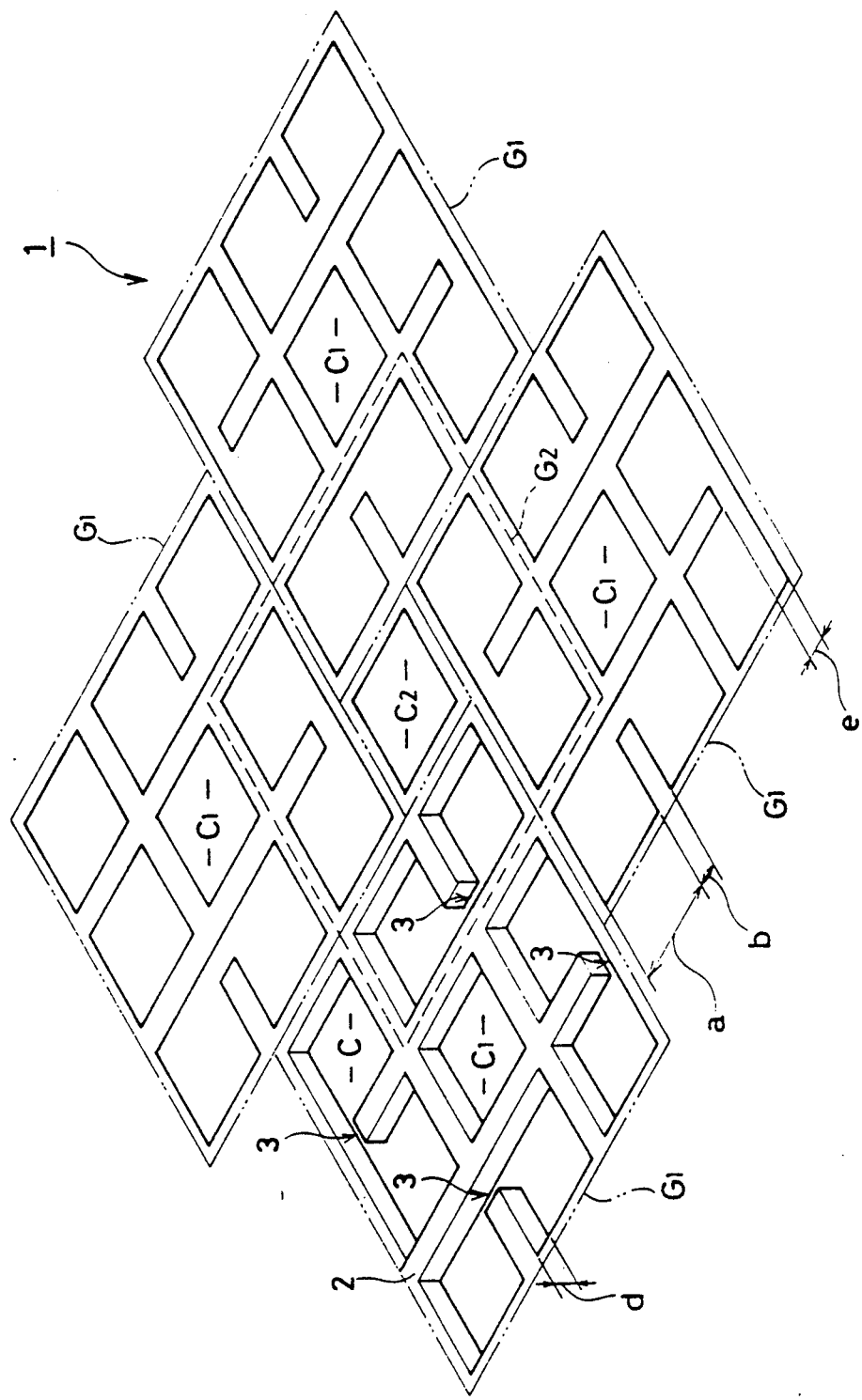
FIG. 9 is a specific perspective view showing a plate surface of a gravure printing plate in accordance with a first embodiment of the present invention.

Embodiments of the present invention will be described in the following with reference to the figures. FIG. 9 is a perspective view schematically showing a plate surface of a shadow portion of a gravure printing plate in accordance with a first embodiment of the invention, and FIG. 10 is a schematic view of a dot pattern (gravure contact screen) thereof.

Figure 10:
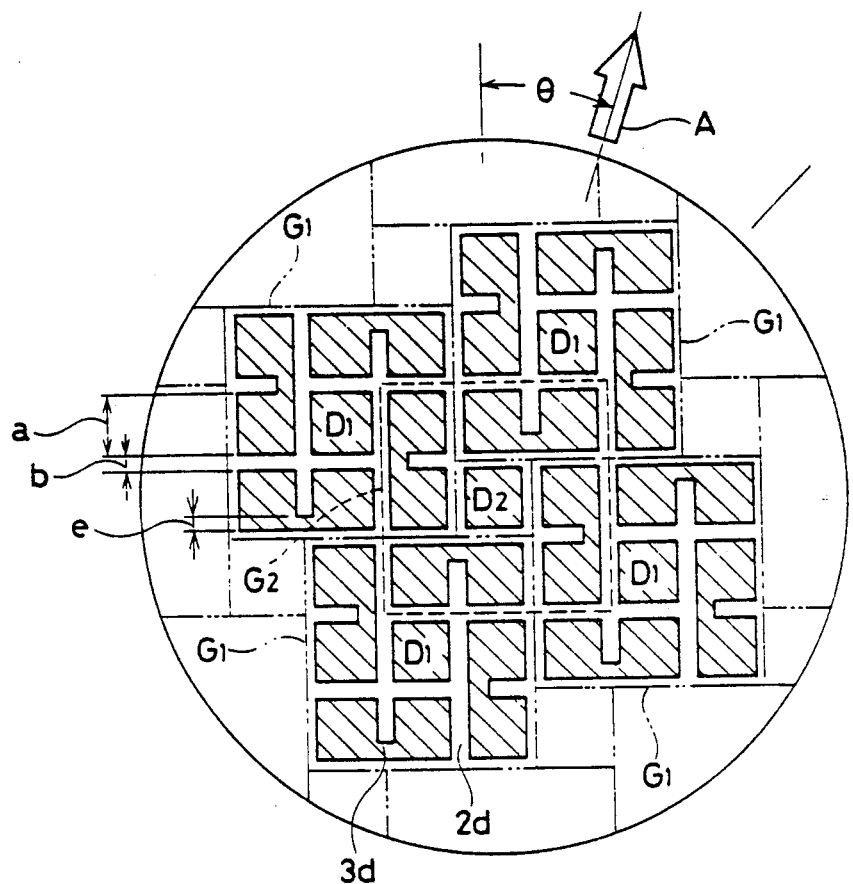
FIG. 10 is a schematic diagram of dot patterns formed by the gravure printing plate shown in FIG. 9.

Referring to FIG. 9, in the gravure printing plate 1 of the present invention, one cell group G1 is formed by 9 cells C in total, i.e., three cells in a vertical direction and three cells in a lateral direction, each cell C (corresponding to the dot D in FIG. 10) having square shape divided by walls 2 (2d in FIG. 10). Adjacent cell groups G1 are arranged separated from each other in the vertical and the lateral directions by one cell C2.

Each cell group G1 comprises a central core cell C1 and 8 cells C surrounding the central cell, with the 8 cells forming four pairs of cells. Each pair of cells has a bottom portion coupled through a notched potion 3 (coupling portion 3d in FIG. 10). The notched portion 3 formed near the intersecting portion of the walls 2 is arranged to be in point symmetry about the center of the cell group C1. When one cell C2 is surrounded by four cell groups G1..., one cell group G2 is formed by the 8 cells C and the central cell C2 which is the core. Namely, by the above described arrangement of the notched portions 3 in each cell group G1 and relative arrangements of the adjacent cell groups, continuation of the notch portioned 3 in the direction of printing A (see FIG. 10) by the prescribed pitches can be prevented. Consequently, the direction of ink flow between the paired cells C becomes random, which makes "mottling" less conspicuous.

In the present embodiment, the "mottling" in the shadow portion (solid portion) is eliminated when the screen ruling (number of dots per unit length = number of cells per unit length) is set to be 175/inch, one side of the cell is set to be $a = 4 \times b$, the width of the wall is set to be $b = 32$ to 35 $\mu$m, the width of notch of the notched portion 3 is set to be $e \approx b$, the depth of the cell is set to be $h = 20$ to 27 $\mu$ma and the screen angle $\theta$ is set to be 18.5°, and at that time, the reflection density reaches 2.85, which is higher by 0.1 than that of the conventional example 1, and the gradation is superior. reflection density is represented as $$Dr = \log_{10} I_0/I_1 \tag{1}$$

where
$I_0$: intensity of reflected light of a reference white board under specific conditions of measurement,
$I_1$: intensity of reflected light from a sample surface under the same conditions.

The screen angle applicable to the present invention is $\theta = 15°$ to 25°.

As shown in FIG. 10, the width e of the notched portion 3 in the shadow portion may be about ⅓ to about 1/6 of the length a of one side of the cell C. If the width of the notch becomes larger than that, two cells serve as one rectangular cell due to the influence of side etching, which is undesirable.

Figure 1:
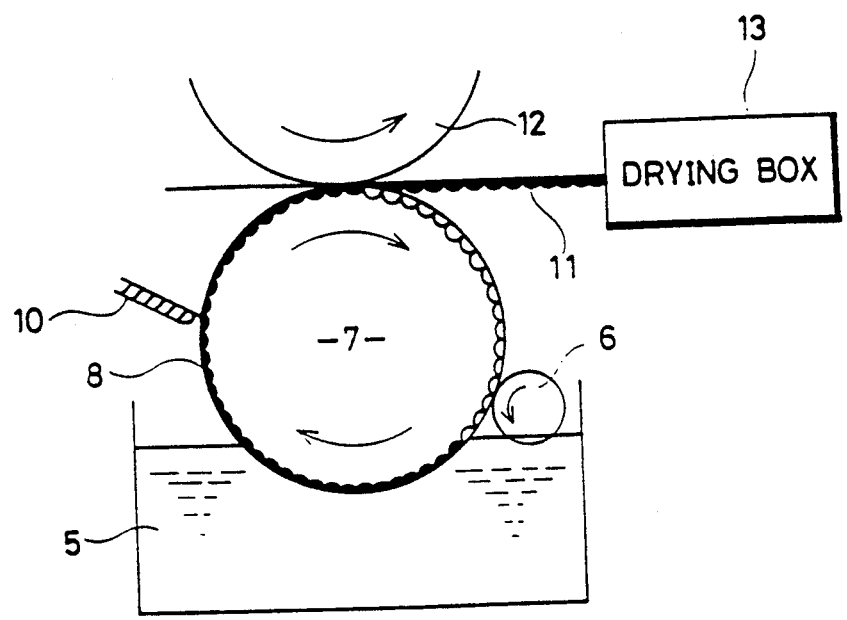
FIG. 1 is a schematic diagram of a web-fed rotary gravure press.
Figure 4:
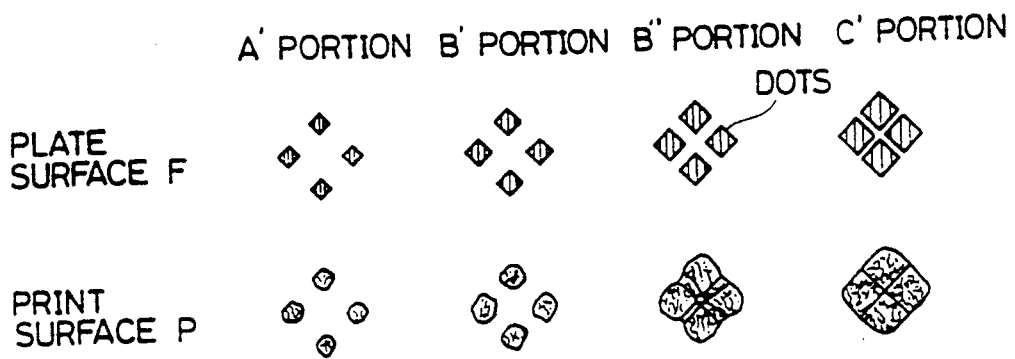
FIG. 4 shows the relations between a plate surface and a print surface in a light portion, middle portions and a shadow portion.
Figure 2A:
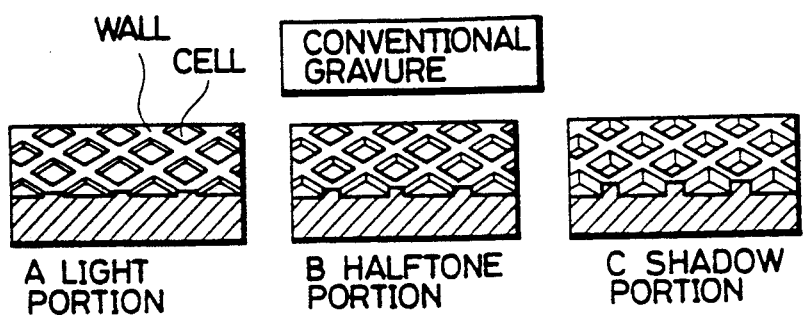
FIGS. 2A to 2C are perspective views, each showing a plate surface of a gravure printing plate.
Figure 2B:
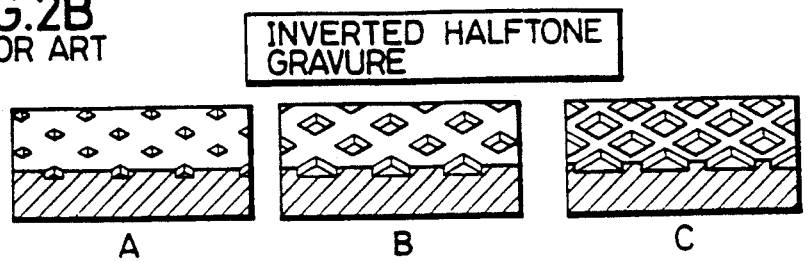
Figure 2C:
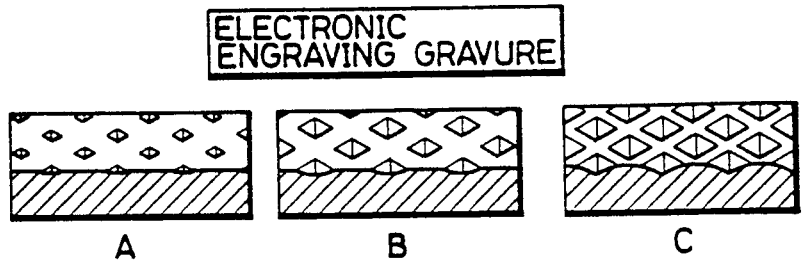
Figure 3:
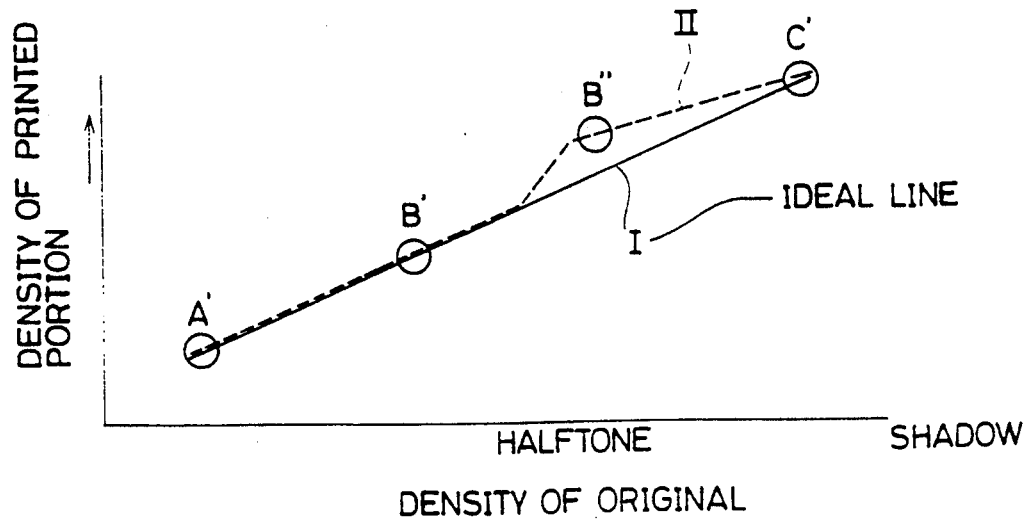
FIG. 3 shows the relation between density of an original and density of a printed matter in gravure printing.
Figure 5:
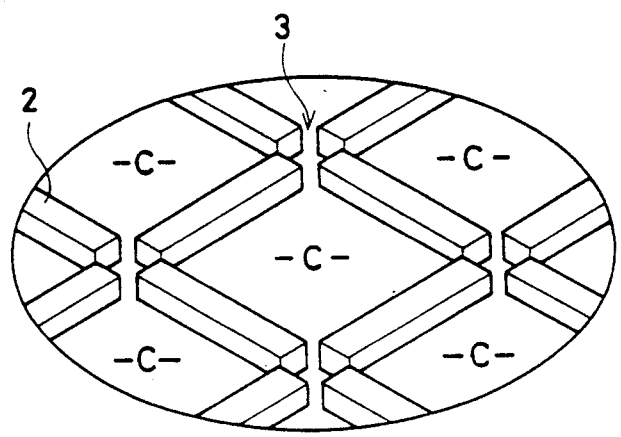
FIGS. 5 and 6 are perspective views showing plate surfaces of conventional gravure printing plates.
Figure 6:
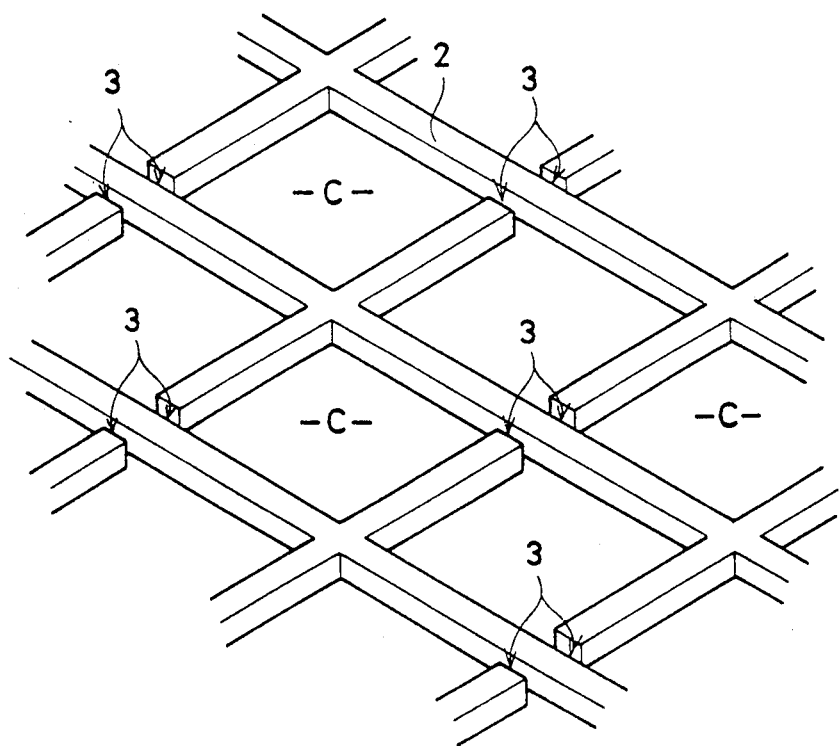
Figure 7:
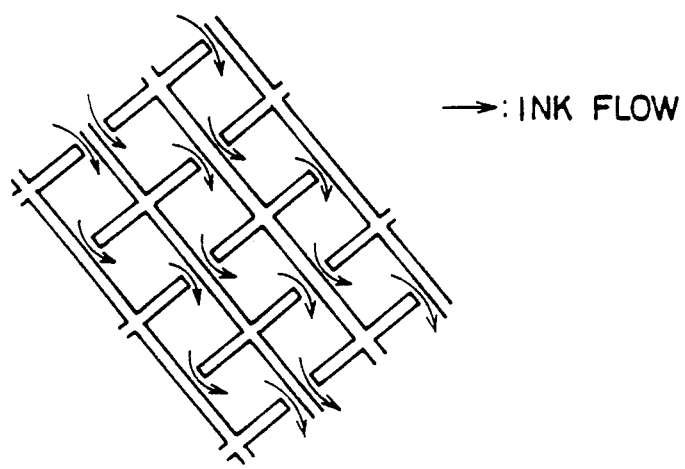
FIG. 7 shows directions of ink flow in the conventional gravure printing plate shown in FIG. 6.
Figure 8A:
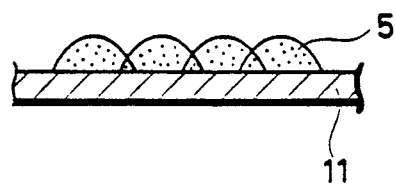
FIGS. 8A and 8B show state of transfer of ink to an object to be printed.
Figure 8B:
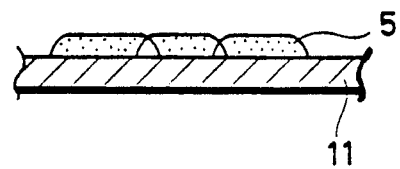
Figure 11:
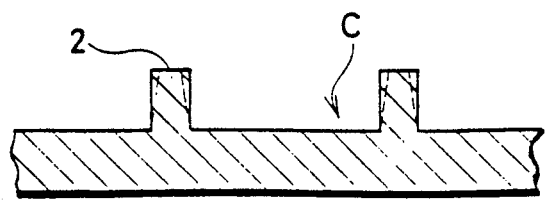
FIG. 11 is a sectional view to explain the side etching.

Side etching means that the shape of the wall becomes as shown by the dotted line in FIG. 11 but not as shown by the solid line.

The above mentioned screen ruling, the ratio of the length "a" of one side of the cell and the width "b" of the wall, the cell depth "h" and the like may be arbitrarily set to be dependent on various predetermined conditions.

Figure 12:
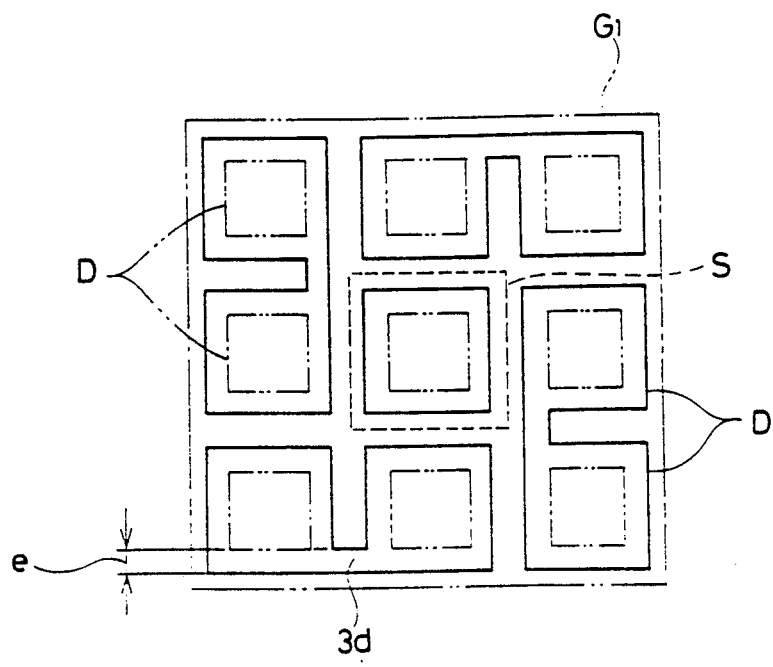
FIGS. 12 to 14 are enlarged views of main portions of the dot patterns formed by inverted halftone gravure.
Figure 13:
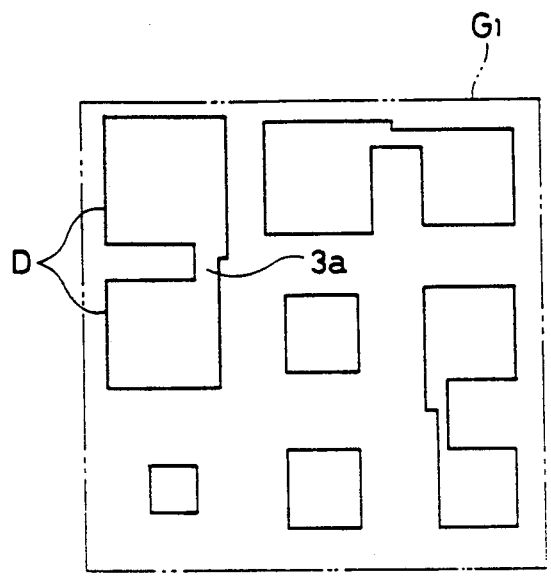
Figure 14:
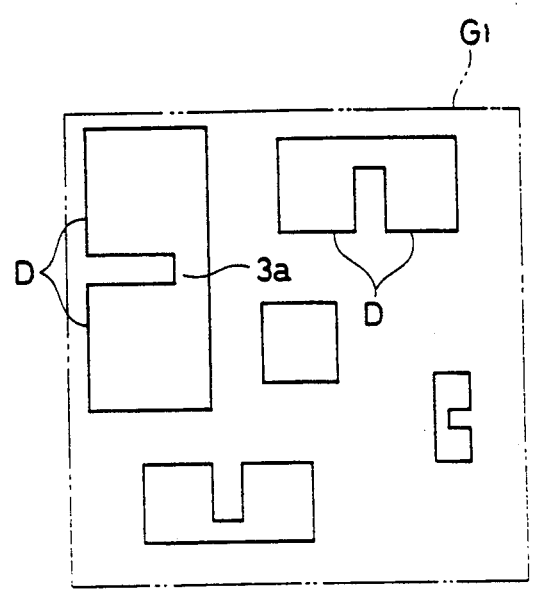

FIGS. 12 to 14 show main portions of dot pattern (gravure contact screen) when the gravure printing plate of the first embodiment is made as an inverted halftone gravure. All of the patterns are the dot patterns recorded on a photosensitive film by an image scanning and recording apparatus (scanner).

Referring to FIG. 12, the size of the dots D ... corresponding to the cells C is defined group by group G1. When the "dot percent", which is the ratio of the dot D in a unit area S proportional to the image density, is not less than a set value (for example 30%), dots are paired to be continuous, and as the dot percent increases, the width of the coupling portion e of the coupling 3d becomes larger. The width "e" of the coupling becomes the largest at the shadow portion. When the dot percent is not more than 30%, the dots D are not coupled to each other as shown by the phantom line. The dots D are set in this manner in consideration of the fact that when the dot percent is small, the width of the wall is sufficiently large to prevent generation of "mottling", and as the dot percent increases, the width of the wall becomes smaller and "mottling" tends to occur. Thus, as the density increases to that of the shadow portion, the width of notches is made larger to facilitate random flow of ink.

In the gravure contact screen shown in FIG. 12, the gradation is represented group by group G1, so that there is a possibility of a decrease in the resolution. In the gravure contact screen shown in FIG. 13, the size of the dots D is defined independently. If the dot percent is not less than 30%, for example, the dots D are paired and coupled. In the gravure contact screen shown in FIG. 13, the width of the notch is made different in every paired dots having different dot percents, which further improves the expression of gradation by that area.

In the gravure contact screen shown in FIG. 14, the size of the dot is defined pair by pair, in order to facilitate formation of the dot pattern. The dots A are formed pair by pair in each character, regardless of the dot percent. However, as described above, the width of the notch (the width of coupling) is made different dependent on the dot percent.

Figure 15:
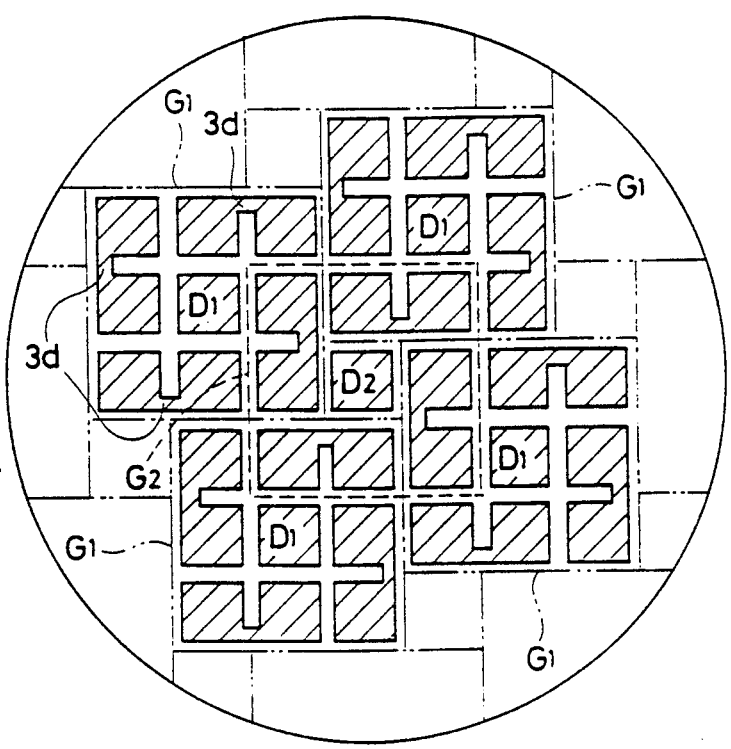
FIG. 15 is a schematic diagram of dot patterns in accordance with a second embodiment of the present invention.

FIG. 15 is a schematic diagram of a dot pattern (gravure contact screen) showing a second embodiment. This embodiment is a modification of the first embodiment. Referring to FIG. 15, this embodiment is different from the first one in that the coupling portion 3d, corresponding to the notched portion in each group G1, indicated by the phantom line, is arranged distant from the central dot D1. In other words, in another group G2, indicated by the dotted line in FIG. 15, the coupling portion 3d is formed near the central core dot D2.

Figure 17:
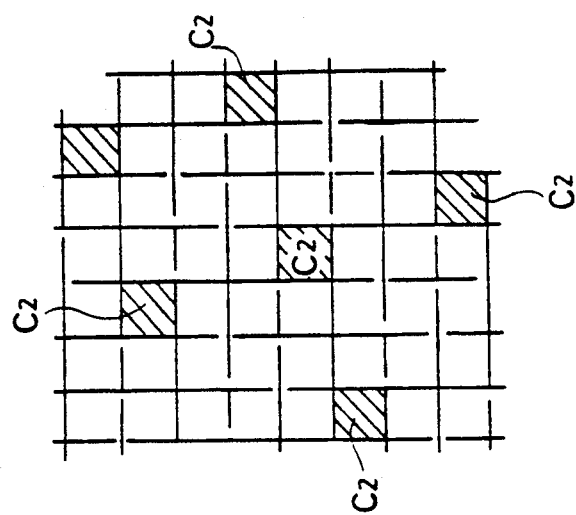
FIGS. 16 to 18 are specific perspective views of gravure printing plates showing third and fourth embodiments of the present invention.
Figure 16:
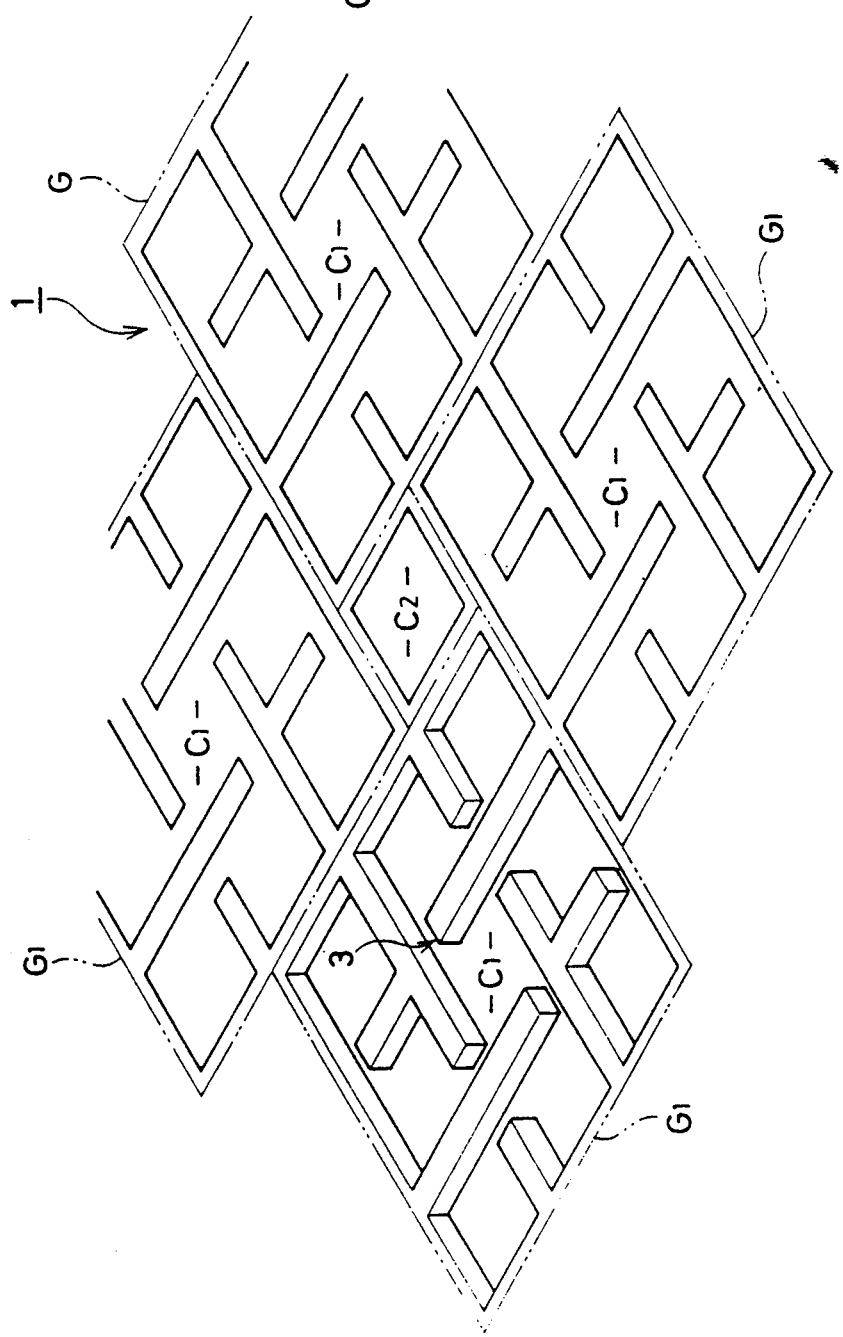

FIG. 16 shows a third embodiment, corresponding to FIG. 9. This embodiment differs from the first embodiment shown in FIG. 9 in that the number of notched portions 3 is increased so that 9 cells C in each group G1 indicated by the phantom line of FIG. 16 are continuous to each other through the central cell C1. The position of the cell C2 without the notched portion is as shown in FIG. 17.

Figure 18:
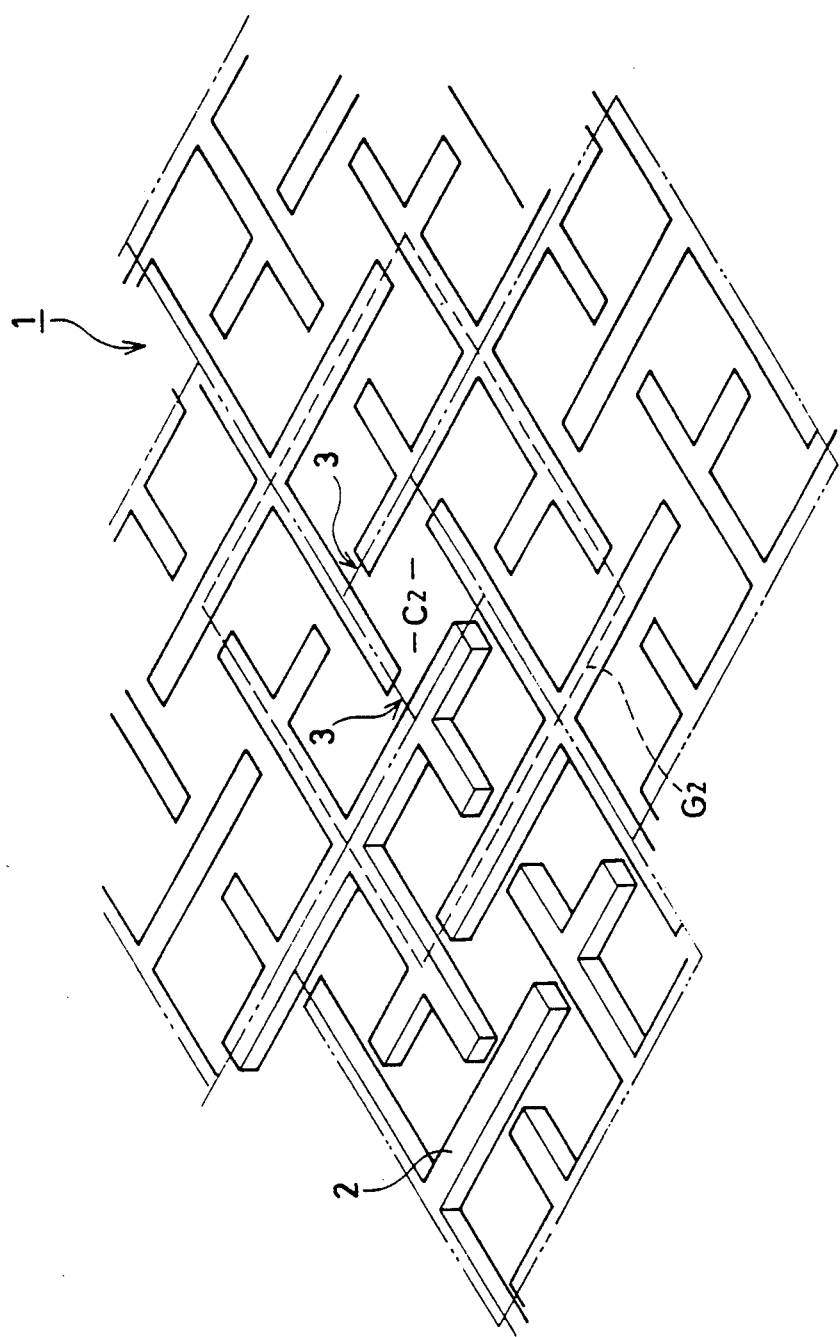

FIG. 18 shows a fourth embodiment, corresponding to FIG. 9. This embodiment differs from the third embodiment in that the notch portions 3 are formed such that cells C are continuous to each other through the central core cell C2 also in the cell group G2, which is indicated by the dotted line in FIG. 16 of the third embodiment.

In the above-described embodiments 1 to 4, each of the cells C or the dots D has a square shape. However, the present invention is not limited thereto, and the form of the cell or the dot may be rectangular, rhomboid or of any arbitrary shape.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A gravure printing plate for transferring ink filled in cells to an object to be printed, comprising:
   a base; and
   a plurality of cell groups formed on said base; wherein
   each of said cell groups includes nine cells formed of three cells adjacent to each other in a first direction and in a second direction intersecting said first direction,
   each cell is surrounded by two sets of opposing walls framed in a third direction intersection said first and second directions, each of the walls having two elongate sides,
   an end portion in said third direction of each of said walls has a flat surface,
   said flat surface forms a printing surface of the gravure printing plate,
   said each cell group includes a core cell positioned at the center and four paired cells adjacent to each other so as to be adjacent to respective sides of the walls of said core cell, and
   notched portions are formed at said end portions of the walls which divide said paired cells.

2. A gravure printing plate according to claim 1, wherein:
   said notched portions are arranged in point symmetry about said core cell.

3. A gravure printing plate according to claim 2, wherein:
   a distance from said core cell to said notched portion of a paired cell adjacent in said first direction to said core cell is equal to a distance from said core cell to said notched portion of a paired cell adjacent in said second direction to said core cell.

4. A gravure printing plate according to claim 2, wherein:
   a distance from said core cell to said notched portion in said first direction is selected to be larger than a distance from said core cell to said notched portion in said second direction.

5. A gravure printing plate according to claim 2, wherein:
   said notched portion is disposed to be as far as possible from said core cell.

6. A gravure printing plate according to claim 2, wherein:
   said walls of said core cell have no notched portion.

7. A gravure printing plate according to claim 6, wherein:
   said plurality of core cells are provided shifted from each other by one cell in said first direction and shifted by two cells in said second direction.

8. A gravure printing plate according to claim 2, wherein:
   a wall provided between said core cell and a cell adjacent thereto is formed to have a notched portion.

9. A gravure printing plate according to claim 8, wherein:
   said notched portion is formed at an intersection of said walls of said core cell.

10. A gravure printing plate according to claim 9, wherein:
    a dimension of an opening portion of said each cell is defined by a distance between said two sets of walls forming said each cell, and
    said dimension of the opening portion is selected to be equal in each of said cell groups.

11. A gravure printing plate according to claim 9, wherein:
    dimension of an opening portion of each cell is defined by a distance between said two sets of walls of said each cell,
    said dimension of said opening portion of each cell being different in said each cell group.

12. A gravure printing plate, comprising:
    a base; and
    nine first cells each surrounded by four walls, formed adjacent to each other on said base, three in a first direction and three in a second direction intersecting said first direction, and one second cell formed and disposed with respect to said first and second directions to be adjacent to corner portion of any of said nine first cells, wherein a cell group is formed by said nine first cells and said second cell, the respective walls of each of said first and second cells are formed to extend in a third direction intersecting said first and second directions on said base, with end portions of the respective walls of said cell group in said third direction forming a flat surface constituting a printing surface of the gravure printing plate, eight cells around a central cell of said nine first cells constitute four paired cells adjacent to each other, and a notched portion being formed at a portion of a wall which divides said paired cells along a wall surface of each wall intersecting an adjacent wall, with each said notched portion being in point symmetry about said central cell.

13. A gravure printing plate according to claim 12, wherein:

walls respectively forming said four sides of said second cell are each adjacent to a wall of a cell at a corner portion of the first cells of each of four of said cell groups, whereby said four cell groups are arranged to share said second cell.

14. A gravure printing plate according to claim 13, wherein:

the respective walls of two pairs of cells arranged to be sandwiching said central cell in said first direction are formed to have notched portions at a position most distant from said central cell, and opening portions of the respective walls of two pairs of cells arranged sandwiching said central cell in said second direction are formed at a position nearest to said central cell.

* * * * *